US008030132B2

(12) United States Patent
Ogita et al.

(10) Patent No.: US 8,030,132 B2
(45) Date of Patent: Oct. 4, 2011

(54) MANUFACTURING METHOD OF SEMICONDUCTOR DEVICE INCLUDING PEELING STEP (75) Inventors: Kaori Ogita, Atsugi (JP); Tomoko Tamura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 630 days.

(21) Appl. No.: 11/442,216

(22) Filed: May 30, 2006

(65) Prior Publication Data
US 2006/0270189 A1  Nov. 30, 2006

(30) Foreign Application Priority Data

May 31, 2005  (JP) ................................. 2005-160729

(51) Int. Cl.
H01L 21/027 (2006.01)
H01L 31/0392 (2006.01)

(52) U.S. Cl. .......... 438/107; 438/26; 438/106; 438/118; 438/458; 438/781; 438/799; 257/684; 257/783; 257/E21.502

(58) Field of Classification Search .................... 438/26, 438/29, 30, 38, 106, 107, 118, 125–127, 438/458–459, 463, 464, 689–757, 759, 763, 438/780, 781, 788–790, 799, 109, 110–114, 438/119, 121, 123, 465, 476; 257/E23.034, 257/E23.055, E23.06, 684, 783, E21.499, 257/E21.5, E21.502, E21.503, E21.505, E21.506
See application file for complete search history.

(56) References Cited

U.S. PATENT DOCUMENTS

| 5,200,362 | A | * | 4/1993 | Lin et al. .......................... 29/841 |
| 5,258,236 | A | | 11/1993 | Arjavalingam et al. |
| 5,650,639 | A | | 7/1997 | Schrantz et al. |
| 5,727,104 | A | | 3/1998 | Sasaki et al. |
| 6,017,636 | A | * | 1/2000 | Tada et al. ................... 428/423.1 |
| 6,127,199 | A | | 10/2000 | Inoue et al. |
| 6,372,608 | B1 | * | 4/2002 | Shimoda et al. .............. 438/455 |
| 6,503,778 | B1 | * | 1/2003 | Yamauchi et al. ............. 438/107 |
| 6,521,511 | B1 | | 2/2003 | Inoue et al. |
| 6,544,430 | B2 | | 4/2003 | McCormack et al. |
| 6,627,518 | B1 | | 9/2003 | Inoue et al. |
| 6,645,830 | B2 | | 11/2003 | Shimoda et al. |
| RE38,466 | E | | 3/2004 | Inoue et al. |
| 6,700,631 | B1 | | 3/2004 | Inoue et al. |

(Continued)

FOREIGN PATENT DOCUMENTS
EP   0858110 A   8/1998
(Continued)

Primary Examiner — Matthew Landau
Assistant Examiner — Maliheh Malek
(74) Attorney, Agent, or Firm — Eric J. Robinson; Robinson Intellectual Property Law Office, P.C.

(57) ABSTRACT

To simplify a peeling step in a method for manufacturing a semiconductor device including the peeling step. A first layer having a metal film is formed over a substrate; a second layer having a transistor is formed over the first layer having the metal film; a resin material is applied over the layer having the transistor; the resin material is cured by a heat treatment at a first heat treatment temperature to form a resin layer; the layer having the transistor is peeled from the substrate by a heat treatment at a second heat treatment temperature which is higher than the first heat treatment temperature; and the resin layer is peeled from the layer having the transistor by a heat treatment at a third heat treatment temperature which is higher than the second heat treatment temperature.

20 Claims, 6 Drawing Sheets

U.S. PATENT DOCUMENTS

| | | | |
|---|---|---|---|
| 6,794,273 B2 * | 9/2004 | Saito et al. .................... 438/462 |
| 6,814,832 B2 | 11/2004 | Utsunomiya |
| 6,818,530 B2 | 11/2004 | Shimoda et al. |
| 6,878,607 B2 | 4/2005 | Inoue et al. |
| 6,885,389 B2 | 4/2005 | Inoue et al. |
| 6,921,675 B2 * | 7/2005 | Yanagisawa et al. ........... 438/26 |
| 7,094,665 B2 | 8/2006 | Shimoda et al. |
| 7,118,990 B1 * | 10/2006 | Xu et al. ...................... 438/455 |
| 7,189,631 B2 | 3/2007 | Yamazaki et al. |
| 7,241,666 B2 * | 7/2007 | Goto et al. ................... 438/455 |
| 7,335,573 B2 | 2/2008 | Takayama et al. |
| 7,351,300 B2 | 4/2008 | Takayama et al. |
| 7,364,954 B2 * | 4/2008 | Kuwashima et al. ......... 438/151 |
| 7,407,870 B2 | 8/2008 | Maruyama et al. |
| 7,482,248 B2 * | 1/2009 | Tamura ........................ 438/458 |
| 7,518,692 B2 * | 4/2009 | Yamazaki et al. ............ 349/153 |
| 7,521,383 B2 | 4/2009 | Morisue et al. |
| 7,704,765 B2 * | 4/2010 | Maruyama et al. ............ 438/30 |
| 2002/0086137 A1 | 7/2002 | Brouillette et al. |
| 2002/0146893 A1 | 10/2002 | Shimoda et al. |
| 2002/0197770 A1 * | 12/2002 | Irie .............................. 438/114 |
| 2003/0008437 A1 | 1/2003 | Inoue et al. |
| 2003/0032210 A1 | 2/2003 | Takayama et al. |
| 2003/0040164 A1 | 2/2003 | Inoue et al. |
| 2003/0047280 A1 | 3/2003 | Takayama et al. |
| 2003/0064569 A1 * | 4/2003 | Takayama et al. ............ 438/455 |
| 2003/0082889 A1 * | 5/2003 | Maruyama et al. ........... 438/455 |
| 2003/0224582 A1 | 12/2003 | Shimoda et al. |
| 2004/0087110 A1 | 5/2004 | Takayama et al. |
| 2004/0099926 A1 | 5/2004 | Yamazaki et al. |
| 2004/0129960 A1 | 7/2004 | Maruyama et al. |
| 2004/0169786 A1 | 9/2004 | Yamazaki et al. |
| 2004/0171262 A1 | 9/2004 | Takayama et al. |
| 2004/0219762 A1 | 11/2004 | Shimoda et al. |
| 2004/0232413 A1 | 11/2004 | Yamazaki et al. |
| 2004/0232459 A1 * | 11/2004 | Takayama et al. ............ 257/295 |
| 2004/0239827 A1 | 12/2004 | Yamazaki et al. |
| 2004/0248377 A1 * | 12/2004 | Yoo et al. ...................... 438/458 |
| 2004/0256618 A1 | 12/2004 | Imai et al. |
| 2004/0259329 A1 | 12/2004 | Boyle et al. |
| 2005/0112805 A1 | 5/2005 | Goto et al. |
| 2005/0214984 A1 | 9/2005 | Maruyama et al. |
| 2005/0282357 A1 * | 12/2005 | Takayama et al. ............ 438/458 |
| 2005/0285231 A1 | 12/2005 | Arao et al. |
| 2005/0287846 A1 | 12/2005 | Dozen et al. |
| 2006/0002047 A1 | 1/2006 | Cheung et al. |
| 2006/0023990 A1 | 2/2006 | Shih et al. |
| 2006/0040471 A1 | 2/2006 | Ramanathan et al. |
| 2006/0054891 A1 * | 3/2006 | Chu et al. ........................ 257/65 |
| 2006/0068536 A1 | 3/2006 | Yamazaki |
| 2006/0110863 A1 * | 5/2006 | Yamamoto et al. ........... 438/149 |
| 2007/0004233 A1 | 1/2007 | Morisue et al. |
| 2007/0010067 A1 * | 1/2007 | Shimoda et al. .............. 438/455 |
| 2007/0158745 A1 | 7/2007 | Yamazaki et al. |
| 2007/0164337 A1 | 7/2007 | Adkisson et al. |
| 2007/0235734 A1 * | 10/2007 | Takafuji et al. .................. 257/57 |
| 2008/0020547 A1 * | 1/2008 | Kostrzewa et al. ........... 438/458 |
| 2008/0049437 A1 | 2/2008 | Takayama et al. |

FOREIGN PATENT DOCUMENTS

| | | |
|---|---|---|
| EP | 0924769 | 6/1999 |
| EP | 1014452 A | 6/2000 |
| EP | 1351308 A | 10/2003 |
| JP | 57119459 A * | 7/1982 |
| JP | 10-125929 A | 5/1998 |
| JP | 10-125930 A | 5/1998 |
| JP | 10-125931 A | 5/1998 |
| JP | 11-243209 A | 9/1999 |
| JP | 2001-189460 A | 7/2001 |
| JP | 2002-184959 | 6/2002 |
| JP | 2003-163338 A | 6/2003 |
| JP | 2004-221561 | 8/2004 |
| WO | WO-2006/123825 | 11/2006 |

* cited by examiner

MANUFACTURING METHOD OF SEMICONDUCTOR DEVICE INCLUDING PEELING STEP

BACKGROUND OF THE INVENTION

1. Field of the Invention

The present invention relates to a manufacturing method of a semiconductor device and a semiconductor device manufactured by applying the method. In particular, the invention relates to a method for peeling a second layer having a transistor from a substrate.

In this specification, a semiconductor device includes, in its category, an integrated circuit such as a memory, a CPU (Central Processing Unit), or a microprocessor, an RFID (Radio Frequency Identification) tag, and other components or products. An RFID tag includes an integrated circuit and is also referred to as a wireless IC tag.

2. Description of the Related Art

As a method for peeling a layer having a thin film transistor, a type of transistor, from a substrate, a method described in Patent Document 1 can be applied (Patent Document 1: Japanese Patent Laid-Open No. 2004-221561). A general description of the method is as follows. A metal film of tungsten or the like and a silicon oxide film which is formed by a sputtering method are provided between a layer having a thin film transistor and a substrate. Then, a heat treatment is conducted so as to form metal oxide at the interface of the metal film and the silicon oxide film. A support is attached to the aforementioned layer having a thin film transistor. Moreover, the layer having a thin film transistor where the support is attached is peeled from the aforementioned substrate by a physical means. The peeled layer having a thin film transistor is attached to a flexible film substrate; finally, the aforementioned support is removed.

Because the number of steps is large, the aforementioned peeling method is not necessarily suitable for industrial mass production. Thus, it is desired that the peeling method is more simplified than conventional methods.

SUMMARY OF THE INVENTION

The subject matter of the present invention disclosed in this specification is a method in which a resin layer is formed after forming a peeling layer over a substrate and forming a second layer having a transistor over the peeling layer, and then the layer having the transistor where the resin layer is formed is peeled from the substrate by a heat treatment and the resin layer is peeled from the layer having the transistor by a heat treatment. It is desired that these are completely peeled by the heat treatment; however, it is not necessarily required to be completely peeled. Peeling of them needs to be promoted by the heat treatment compared to the state before the heat treatment.

In other words, a mode of the present invention disclosed in this specification is a manufacturing method of a semiconductor device including the steps of: forming a first layer having a metal film over a substrate; forming a second layer having a transistor over the first layer having the metal film; applying a resin material over the layer having the transistor; curing the resin material by a heat treatment at a first heat treatment temperature to form a resin layer; peeling the layer having the transistor from the substrate by a heat treatment at a second heat treatment temperature which is higher than the first heat treatment temperature; and peeling the resin layer from the layer having the transistor by a heat treatment at a third heat treatment temperature which is higher than the second heat treatment temperature.

In addition, another mode of the present invention disclosed in this specification is a manufacturing method of a semiconductor device including the steps of: forming a first layer having a metal film over a substrate; forming a second layer having a transistor over the first layer having the metal film; applying a resin material over the layer having the transistor; curing the resin material by a heat treatment at a first heat treatment to form a resin layer; exposing a part of the first layer having the metal film in a region where the transistor is not provided over the first layer having the metal film; peeling the layer having the transistor from the substrate by a heat treatment at a second heat treatment temperature which is higher than the first heat treatment temperature in a heating apparatus; and peeling the resin layer from the layer having the transistor by a heat treatment at a third heat treatment temperature which is higher than the second heat treatment temperature without extracting from the heating apparatus.

In addition, still another mode of the present invention disclosed in this specification is a manufacturing method of a semiconductor device including the steps of: forming a first layer having a metal film over a substrate; forming a second layer having a transistor over the first layer having the metal film; exposing a part of the first layer having the metal film in a region where the transistor is not provided over the first layer having the metal film; applying a resin material over the layer having the transistor so as not to cover a region where a part of the first layer having the metal film is exposed; curing the resin material by a heat treatment at a first heat treatment temperature in a heating apparatus to form a resin layer; peeling the layer having the transistor from the substrate by a heat treatment at a second heat treatment temperature which is higher than the first heat treatment temperature without extracting from the heating apparatus; and peeling the resin layer from the layer having the transistor by a heat treatment at a third heat treatment temperature which is higher than the second heat treatment temperature without extracting from the heating apparatus.

In the case of manufacturing an RFID tag (wireless IC tag) as a semiconductor device, the RFID tag can be manufactured by forming a second layer having a transistor over a substrate with a metal film interposed therebetween, forming an antenna so as to be electrically connected to a transistor in the layer having the transistor, forming a resin layer over the layer having the transistor and the antenna, peeling the layer having the transistor and the antenna from the substrate, and peeling the resin layer.

Further, an RFID (wireless IC tag) tag can be manufactured by forming a second layer having a transistor over a substrate with a first layer having a metal film interposed therebetween, thereafter forming a resin layer over the layer having the transistor without forming an antenna, peeling the layer having the transistor from the substrate, peeling the resin layer, electrically connecting a transistor in the layer having the transistor to an antenna (preferably with a film-like shape) which is formed over another substrate and prepared as a component.

A second layer having a transistor can be peeled without a physical means by the invention disclosed in this specification. The physical means is a shock (stress) externally given using a human hand, pressure of a gas blown from a nozzle, ultrasonic waves, or the like. Manufacturing steps thereof can be more simplified than conventional methods, and thus the number of steps can be reduced so that a yield is improved. In addition, by peeling a substrate and a resin layer from a second layer having a transistor (in particular, a thin film transistor), a semiconductor device, such as an RFID tag, can be thinned. Furthermore, since a peeled substrate can be reused, a manufacturing cost can be reduced.

DETAILED DESCRIPTION OF THE INVENTION

Embodiment modes and embodiments of the invention will be described hereinafter with reference to the accompanying drawings. However, the invention is not limited to the following description, and it is easily understood by those skilled in the art that the modes and details can be changed in various ways without departing from the spirit and scope of the invention. Therefore, the invention is not interpreted as being limited to the following description.

Embodiment Mode 1

Figure 1A:
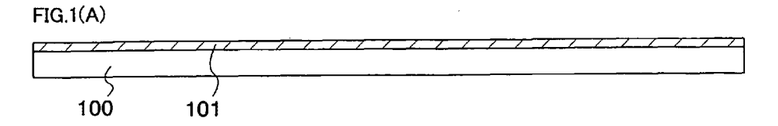
FIGS. 1A to 1E are cross sectional views showing a manufacturing process of a semiconductor device according to Embodiment Mode 1.

As shown in FIG. 1A, a substrate 100 is prepared and a peeling layer 101 is provided over the substrate 100. Specifically, as the substrate 100, for example, a glass substrate such as a barium borosilicate glass substrate or an alumino-borosilicate glass substrate, a quartz substrate, a ceramic substrate, or the like can be used. A metal substrate of stainless steel or the like, or a semiconductor substrate over which an insulating film is formed may also be used. The substrate 100 may be thinned or planarized by a polishing method such as mechanical polishing or CMP (chemical mechanical polishing). A substrate formed of a flexible synthetic resin such as plastic generally tends to have lower heat resistance than the aforementioned glass substrate, quartz substrate, and ceramic substrate; however, a substrate formed of a flexible synthetic resin such as plastic can be used as the substrate 100 as long as the substrate 100 can withstand treating temperature in the manufacturing steps.

The peeling layer 101 is formed of a metal film which mainly contains an element selected from tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir). In this embodiment mode, a metal film which mainly contains tungsten is used as the peeling layer 101. Note that a method for forming the metal film is a sputtering method, a CVD method, or the like, and in this embodiment mode, a sputtering method is used to form the metal film.

Metal oxide is formed on the metal film, and the metal film and the metal oxide can be used as the peeling layer 101. For example, the metal oxide is formed in the shape of a thin film. In other words, the peeling layer 101 is a first layer having a metal film. When the metal film mainly contains tungsten, the metal oxide is tungsten oxide. Tungsten oxide is represented by $WO_E$, where x is 2 to 3. There are cases where x is 2 ($WO_2$), x is 2.5 ($W_2O_5$), x is 2.75 ($W_4O_{11}$), x is 3 ($WO_3$), and the like. In forming tungsten oxide $WO_K$, the value of x is required to be in the above range. In addition, as a combination of a metal film and metal oxide formed on the metal film, molybdenum and molybdenum oxide, niobium and niobium oxide, titanium and titanium oxide, and the like can be used.

The aforementioned metal oxide can be formed by plasma oxidation of the metal film. When the plasma oxidation is performed, high quality metal oxide which suppresses plasma damage can be formed by an apparatus capable of generating plasma having high electron density of $1 \times 10^{11}$ $cm^{-3}$ or more, for example, $1 \times 10^{12}$ $cm^{-3}$ to $1 \times 10^{13}$ $cm^{-3}$ and low electron temperature of 1.5 eV or less, for example, 0.5 eV to 1.0 eV with no magnetic field. Formation of the metal film and formation of the metal oxide may be continuously carried out. On this occasion, a multi-chamber apparatus provided with a chamber for sputtering or CVD and a chamber for plasma treatment can be used. The plasma oxidation is performed by exposing the surface of a metal film to plasma which is generated from a gas including oxygen. The peeling layer 101 may be formed of a film which is formed by $N_2O$ plasma treatment, in other words, exposing the surface of a metal film to plasma generated from a gas including $N_2O$.

In FIG. 1A, the peeling layer 101 is formed directly on the substrate 100; however, a base layer which is not shown here may be formed of an insulating film of silicon oxide, silicon nitride, silicon oxide containing nitrogen (silicon oxynitride), silicon nitride containing oxygen, or the like between the substrate 100 and the peeling layer 101. In particular, in the case where contamination from the substrate is concerned, the base layer is preferably formed. When a glass substrate or a quartz substrate is used as the substrate 100, the base layer can be formed by plasma oxidation or plasma nitridation of the surface of the substrate 100 with an apparatus which can generate the aforementioned plasma having high electron density and low electron temperature with no magnetic field. Alternatively, the base layer may be formed by carrying out plasma oxidation or plasma nitridation on the aforementioned insulating film which is formed by CVD by an apparatus capable of generating the plasma having high electron density and low electron temperature with no magnetic field. Formation of the insulating film and either plasma oxidation or plasma nitridation may be continuously carried out. On this occasion, a multi-chamber apparatus provided with a chamber for CVD and a chamber for plasma treatment can be used.

If necessary, an insulating layer 102 is provided over the peeling layer 101. For example, the insulating layer 102 may be formed of silicon oxide, silicon nitride, silicon nitride containing oxygen, silicon oxide containing nitrogen (silicon oxynitride), or the like by a CVD method.

Figure 1B:
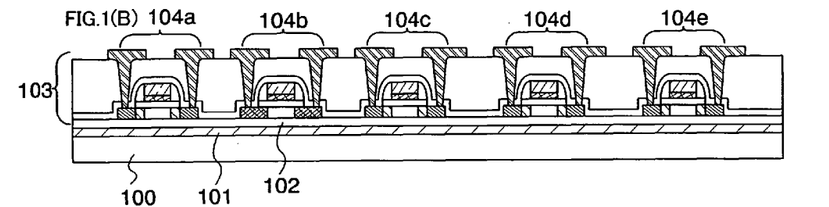

Next, a layer 103 having a transistor is formed over the peeling layer 101 (when an insulating layer 102 is formed, the layer 103 is formed over the layer 102). In this embodiment mode, a thin film transistor is used as a transistor. The layer 103 having a transistor includes a thin film transistor, a wire extended from a gate electrode, a wire connected to a source region or drain region, and interlayer insulating film. FIG. 1B shows an example of the layer 103 having a transistor. In this example, the layer 103 having a transistor further includes a side wall formed of silicon oxide or the like at a side face of the gate electrode, and a passivation film made of an inorganic material such as silicon nitride, which is provided so as to cover the gate electrode, the source region, and the drain region. A thin film transistor is not limited to the structure shown in FIG. 1B and may be, for example, a multigate structure where two or more thin film transistors are connected in series, a structure where gate electrodes are provided above and below an active layer including a channel region with insulating films interposed therebetween, or an inverted staggered type where a gate electrode is provided between an active layer including a channel region and a substrate with gate insulating films interposed. In addition, any of an n-channel thin film transistor, a p-channel thin film transistor, and a combination of them may be used in accordance with a semiconductor device to be manufactured.

Each of gate electrodes of thin film transistors 104a, 104b, 104c, 104d, and 104e is formed with at least two layers. For example, each of bottom layers of these gate electrodes can be formed with a layer mainly containing metal oxide (such as titanium nitride, tungsten nitride, and tantalum nitride) having conductivity, and each of upper layer of these gate electrodes can be formed with a layer mainly containing refractory metal (such as tantalum, tungsten, titanium, and molybdenum). Then, in each of the thin film transistors 104a, 104c, 104d, and 104e, an LDD region is provided between a source or drain region and a channel forming region, and in the thin film transistor 104b, an LDD region is not provided. A CMOS circuit can be formed by combining both of the thin film transistors as a p-channel type and the thin film transistor as an n-channel type.

In each of the thin film transistors 104a, 104c, 104d, and 104e, in order to easily form the LDD region, the source region, and the drain region using the gate electrode as a mask, the bottom layer of the gate electrode is formed so as to overlap the layer with the LDD region by making a gate length of the bottom layer longer than a gate length of the upper layer.

A semiconductor material for forming an active layer having a channel formation region in each of the thin film transistors 104a, 104b, 104c, 104d, and 104e can be selected from materials including silicon, germanium, or both of silicon and germanium, and in addition, an optimal structure can be selected from polycrystalline, monocrystalline, microcrystalline, and amorphous structures. A polycrystalline silicon film is formed by crystallizing an amorphous silicon film with a metal such as nickel by a heat treatment at a temperature equal to or less than a strain point of a glass substrate, and then removing the metal such as nickel from the crystallized film by gettering. A polycrystalline silicon film may be formed by irradiating an amorphous silicon film with a laser beam which is absorbed by the amorphous silicon film, for example, a laser beam of which wavelength is in an ultraviolet light region. When a quartz substrate is used as the substrate 100, a polycrystalline silicon film is provided by crystallizing an amorphous silicon film through heating at a temperature of 800° C. or more without using a metal such as nickel. Thus, a step of removing a metal such as nickel by gettering is not necessary.

Figure 1C:
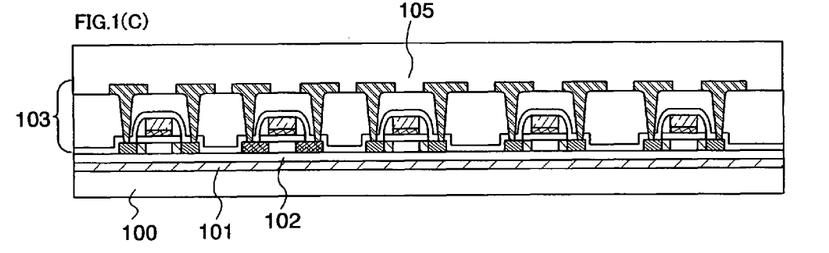

Next, resin is applied over the layer 103 having a transistor, then the resin is cured through a first heat treatment with a heating apparatus such as an oven or a furnace to form a resin layer 105 (see FIG. 1C). As a resin material which is applied here, an appropriate material is selected from heat curing resin, ultraviolet curing resin, vinyl acetate resin, vinyl copolymer resin, epoxy resin, urethane resin, and acrylic resin. Note that a resin material which has curing temperature above 150° C. is not used. A first heat treatment temperature is in the range of 50° C. or more and less than 90° C. In the case of using epoxy resin, the applied resin can be cured by a heat treatment for two hours with the first heat treatment temperature set at 80° C.

As a method for applying resin to form the resin layer 105, a screen printing method, a spin coating method, a droplet discharge method, a dip coating method, or the like can be used.

Before forming the resin layer 105, a new insulating layer which can withstand the first heat treatment and second and third heat treatments described later may be formed over the layer 103 having a transistor to reinforce the mechanical strength of the layer 103 having transistor. In this case, a material such as heat curing resin, ultraviolet curing resin, vinyl acetate resin, vinyl copolymer resin, epoxy resin, urethane resin, acrylic resin, silicon oxide, silicon oxide containing nitrogen (silicon oxynitride), silicon nitride, silicon nitride containing oxygen, and a siloxane material may be selected as an appropriate material for the insulating layer. An organic group containing at least hydrogen (such as an alkyl group or aromatic hydrocarbon) is used as a substituent of a siloxane material. Alternatively, a siloxane material has a skeleton formed of the bond of silicon and oxygen, in which a fluoro group and an organic group containing at least hydrogen may be used as the substituent.

When an antenna for an RFID tag is provided, the antenna can be formed by a sputtering method, a screen printing method, or the like so as to be electrically connected to a wire which is connected to a source or drain region of a thin film transistor included in the layer 103 having a transistor. In the case of a sputtering method, the antenna is formed in the predetermined shape after forming a metal film of aluminum or the like. In the case of a screen printing method, conductive metal paste is baked after it is printed in the predetermined shape of antenna with the conductive metal paste (for example, silver paste). When an insulating layer is formed to reinforce the mechanical strength of the layer 103 having a transistor, it can be formed so as to cover an antenna. The antenna can be formed in an annular shape (for example, a loop antenna), a spiral shape (for example, a spiral antenna), a linear shape (for example, a dipole antenna), or a flat shape (for example, a patch antenna). In the case of applying radio frequency of a UHF band of 860 to 960 MHz or a frequency band of 2.45 GHz, either a shape for forming a dipole antenna or a shape for forming a patch antenna may be adopted as a signal transmitting method.

Figure 5A:
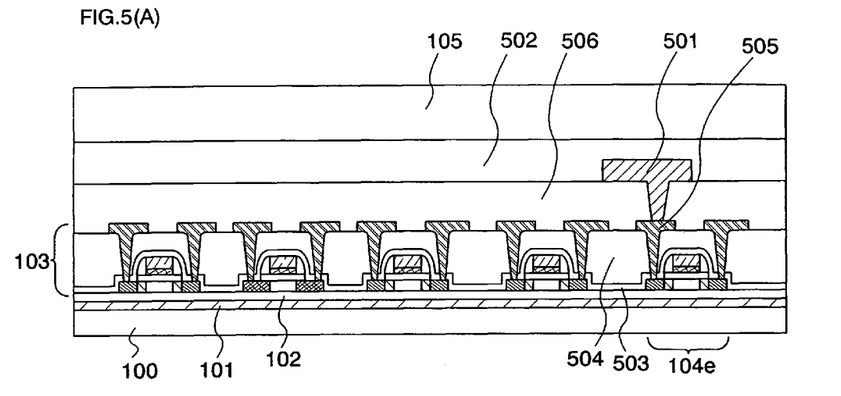
FIGS. 5A and 5B are cross sectional views showing a manufacturing process of an RFID tag.

FIG. 5A shows an example that an antenna 501 and an insulating layer 502 are provided over the layer 103 having a transistor to reinforce the layer 103. A wire 505 which is connected to the source or drain region of the thin film transistor 104e is provided through a contact hole formed in a passivation film 503 (also called a protection film) and a first interlayer insulating film 504. A second interlayer insulating film 506 is provided over the wire 505, and the antenna 501 is provided over the second interlayer insulating film 506 so as to be electrically connected to the wire 505. Because the insulating layer 502 is forced so as to cover the antenna 501, the effect that the antenna 501 is protected is also expected. Then, a resin layer 105 is formed over the insulating layer 502.

The passivation film 503 which is provided to protect a thin film transistor is formed with an inorganic insulating film such as silicon nitride, silicon nitride including oxygen, and silicon nitride including nitrogen (silicon oxinitride) by, for example, a CVD method. At this time, plasma oxidation or plasma nitridation may be carried out by an apparatus capable of generating the plasma having high electron density and low electron temperature with no magnetic field. Formation of the inorganic insulating film and either plasma oxidation or plasma nitridation may be continuously carried out. On this occasion, a multi-chamber apparatus provided with a chamber for CVD and a chamber for plasma treatment can be used.

Acrylic resin, polyimide resin, oxazole resin, a siloxane material, or the like can be used for the first interlayer insulating film 504 and the second interlayer insulating layer 506. It is preferable that the surfaces of these interlayer insulating layers are flat. Oxazole resin is suitable for the first interlayer insulating layer 504 and the second interlayer insulating layer 506 because the oxazole resin has lower dielectric constant than that of polyimide and can suppress generation of parasitic capacitance.

The wire 505 preferably has a stacked structure of two or more layers when it is formed with a material mainly containing aluminum. A sputtering method may be successively performed without exposing to atmosphere to form a stacked structure of a first layer mainly containing aluminum and a second layer mainly containing a highly heat-resistant refractory metal (titanium, molybdenum, tantalum, tungsten, or the like), or a three layer structure where the first layer is sandwiched between the second layers.

When a capacitor element which is used in a DRAM that is a type of memory is provided, the capacitor element is formed so as to be electrically connected to a wire which is connected to a source region or a drain region of a thin film transistor of the layer 103 having a thin film transistor.

Figure 1D:
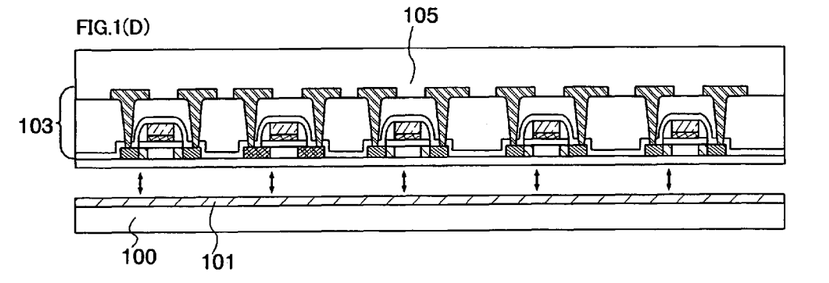

After forming the resin layer 105, a second heat treatment is performed at a temperature which is higher than the first heat treatment temperature, and the substrate 100 and the layer 103 having a transistor are separated (see FIG. 1D). The second heat treatment promotes separation of the substrate 100 and the layer 103 having a transistor compared to before the second heat treatment. When the second heat treatment is performed, the heating apparatus which is used in the first heat treatment can be used. After the separation, the insulating layer 102 and/or a part of the peeling layer 101 (for example, metal oxide) may be attached to the layer 103 having a transistor. In the case of using the peeling layer 101 where a tungsten oxide film congaing nitrogen is formed by an $N_2O$ plasma treatment on the surface a film mainly containing tungsten, the tungsten oxide film is separated into two layers and they attach to both the substrate 100 side and the side of the layer 103 having a transistor.

Figure 1E:
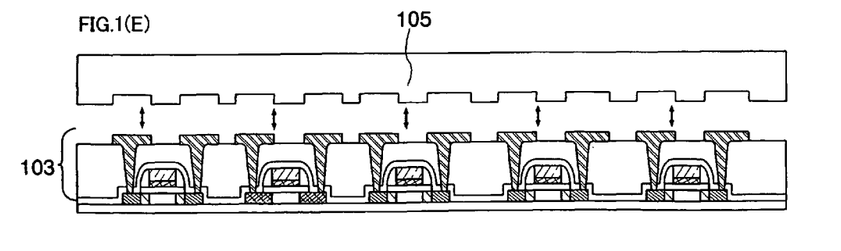

After the second heat treatment, the layer 103 having a transistor and the resin layer 105 are separated by a successive third heat treatment at a temperature higher than that of the second heat treatment (see FIG. 1E). The third heat treatment makes adhesiveness between the resin layer 105 and a lower layer which is in contact with it weaker or lost. The third heat treatment promotes separation of the layer 103 having a transistor and the resin layer 105 compared to before the third heat treatment. When the third heat treatment is performed, the heating apparatus which is used in the second heat treatment can be used. By the third heat treatment without extracting the layer 103 having a transistor which is separated by the second heat treatment from the heating apparatus, the second and third heat treatments can be performed successively. The first to third heat treatments may be performed successively without extracting from the heating apparatus.

The second heat treatment temperature is in the range of, for example, 90° C. to 120° C. In addition, the third heat treatment temperature is, for example, 150° C. or more so as to weaken or eliminate the adhesiveness like above. The upper limit of the third heat treatment temperature needs to be such a temperature as to not affect the substrate 100 and the layer 103 having a transistor; for example, it is 250° C., preferably 200° C. The second heat treatment and the third heat treatment lead to deformation of the resin layer 105 by expansion or the like and generation of stress in the resin layer 105. As a result, it is though possible to separate the substrate 100 and the layer 103 having a transistor, and to separate the layer 103 having a transistor and the resin layer 105.

Figure 5B:
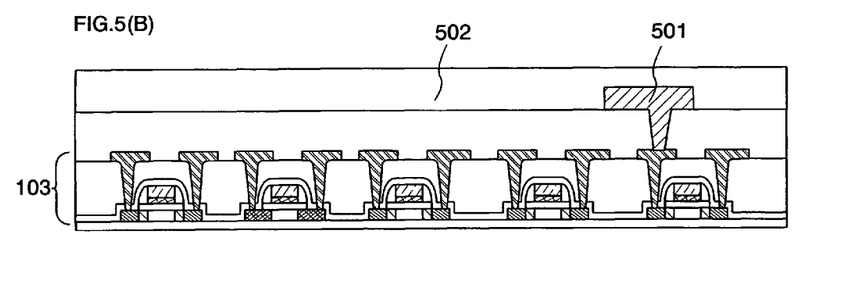
Figure 6A:
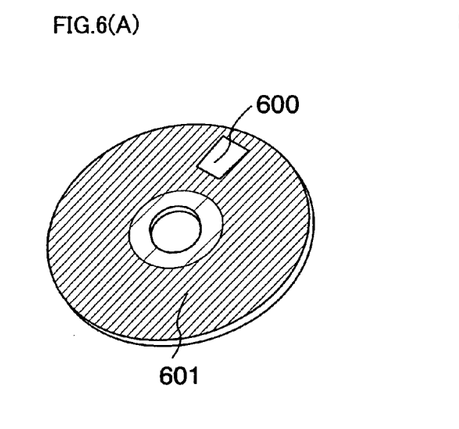
FIGS. 6A to 6D are views showing examples of uses of an RFID tag.
Figure 6B:
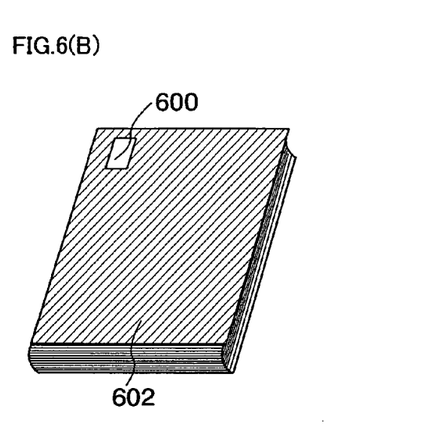
Figure 6C:
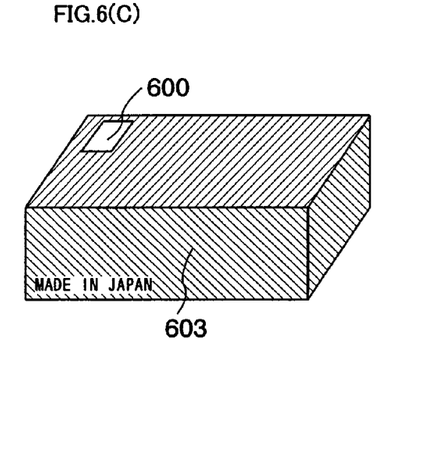
Figure 6D:
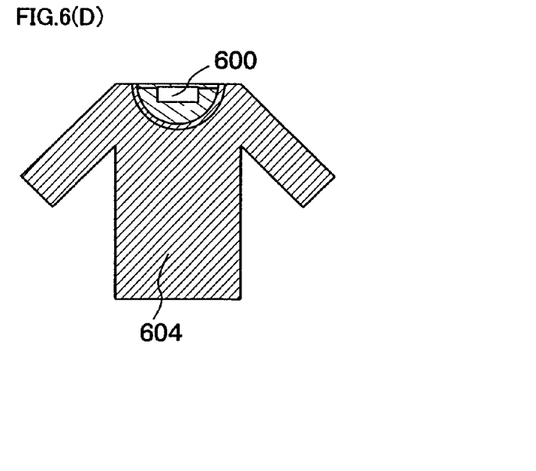

FIG. 5B shows the layer 103 having a transistor after peeling the resin layer 105 and the substrate 100 in FIG. 5A. Because the insulating layer 502 is provided, the strength of the layer 103 having a transistor is still high after the substrate 100 is peeled, and the destruction of the layer 103 having a transistor can be suppressed. In addition, the insulating layer 502 can protect the antenna 501 as well.

By the steps mentioned above, the substrate 100 and the resin layer 105 can be separated from the layer 103 having a transistor. After that, in stead of the peeled substrate 100, a substrate having flexibility, a film, or the like may be attached to the layer 103 having a transistor, if necessary.

In this embodiment mode, by adjusting the heat treatment temperature, the first heat treatment for forming the resin layer 105, the second heat treatment for peeling the layer 103 having a transistor from the substrate 100, and the third heat treatment for peeling the resin layer 105 from the layer 103 having a transistor can be performed at once. Thus, a peeling step can be more simplified and the number of the steps is further reduced compared to conventional one.

Embodiment Mode 2

This embodiment mode can be implemented freely combining with the above Embodiment Mode 1.

In this embodiment mode, a step of exposing a part of the peeling layer 101, for example, a cross section of a metal film or film-like metal oxide included in the peeling layer 101, is added to Embodiment Mode 1 after the first heat treatment for forming the resin layer 105 or before applying resin for forming the resin layer 105. This step allows the layer 103 having a transistor to be peeled more easily from the substrate 100 than the case where the step is not performed.

As an example of a method for exposing a part of the peeling layer 101, for example, a cross section of a metal film included in the peeling layer 101, there is a method by which irradiation with a laser beam is performed, the end surface of the substrate 100 where the peeling layer 101 is formed is ground, and the substrate 100 where the peeling layer 101 is formed is cut, and the like after forming the resin layer 105 or before forming the resin layer 105. By any method, a part of the peeling layer 101 is desirably exposed in a region where the peeling layer does not overlap with a thin film transistor. The region where the peeling layer does not overlap with a thin film transistor is a region where a thin film transistor is provided over the peeling layer 101. When a part of the peeling layer 101 is exposed before applying a resin to form the resin layer 105, a resin needs to be applied so as not to cover the region where a part of the peeling layer 101 is exposed.

Figure 2A:
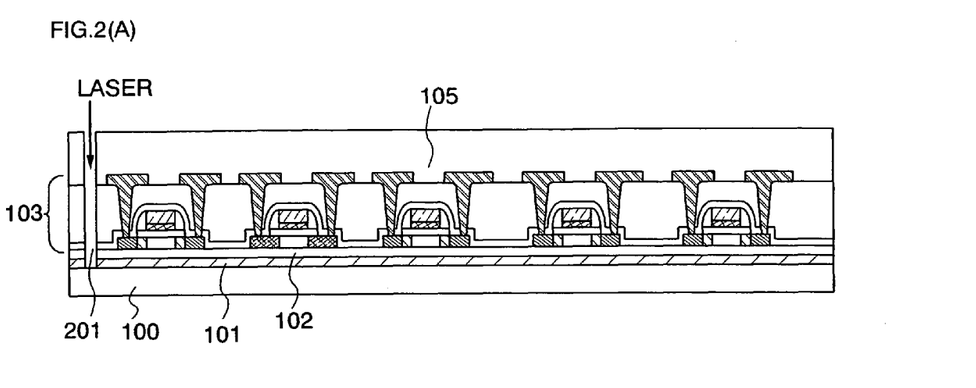
FIGS. 2A and 2B are cross sectional views showing a manufacturing process of a semiconductor device according to Embodiment Mode 2.
Figure 2B:
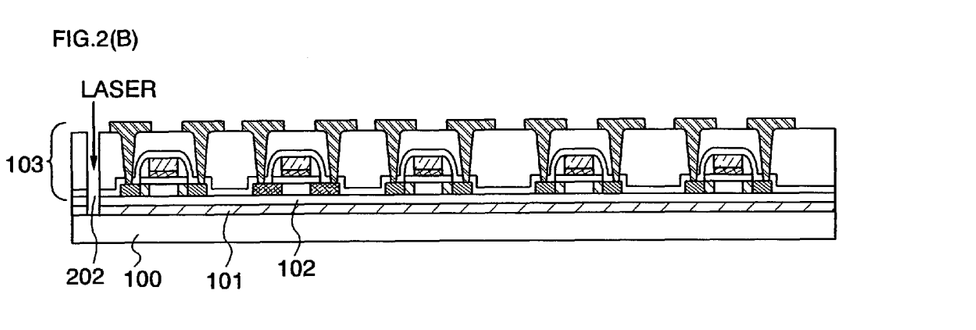

FIG. 2A shows a state that an opening 201 which exposes a part of the peeling layer 101 by irradiating the resin layer with a laser beam from above is formed after forming the resin layer 105. FIG. 2B shows a state that an opening 202 which exposes a part of the peeling layer 101 by irradiating the layer 103 having a transistor with a laser beam from above is formed before applying a resin for forming the resin layer 105. The opening 201 or the opening 202 allows the layer 103 having a transistor to be easily peeled from the substrate 100.

Any kind of laser beam can be used as long as it is able to form an opening in the resin layer 105, the layer 103 having a transistor, the insulating layer 102, and the peeling layer 101. For example, a harmonic of a laser for which a solid such as Nd:YAG or Nd:YVO$_4$ is used as a medium, an excimer laser, or the like, which has a wavelength in an ultraviolet light region, can be used.

Also in this embodiment mode, as in Embodiment Mode 1, an insulating layer can be formed to reinforce the mechanical strength of the layer 103 having a transistor over the layer 103 having a transistor before forming the resin layer 105. When the opening 202 which exposes a part of the peeling layer 101 is formed before the insulating layer is formed, the insulating layer is formed so as not to cover the opening 202.

Note that an integrated circuit with the layer 103 having a thin film transistor in this embodiment mode and Embodiment Mode 1 can be manufactured to have a thickness of 0.2 μm or less, typically 40 nm to 170 nm, preferably 50 nm to 150 nm. Thus, thinning of an integrated circuit can be achieved compared to a conventional IC chip which is formed on a silicon wafer.

Moreover, the peeled substrate 100 in this embodiment mode and embodiment mode 1 can be reused again and again. As described above, if the substrate 100 is reused, cost can be reduced. When the substrate 100 is reused, control is performed so that the substrate 100 is not damaged in a peeling step. Even if the substrate is damaged, a planarization treatment may be performed on the substrate 100.

Embodiment Mode 3

An example of a memory manufactured using the layer 103 having a transistor obtained by the present invention disclosed in this specification is shown.

Figure 3A:
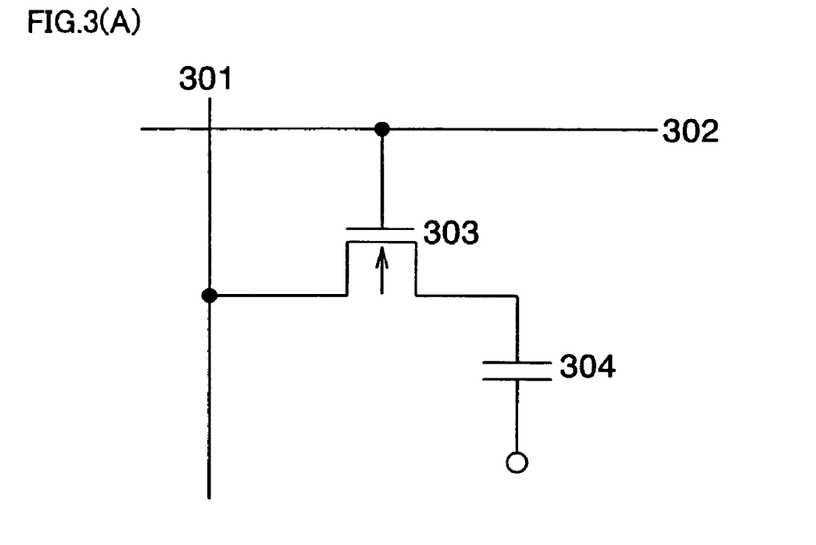
FIGS. 3A and 3B are circuit diagrams showing examples of a memory cell structure.

FIG. 3A is a circuit diagram showing an example of a memory cell structure of a DRAM (Dynamic Random Access Memory), and the DRAM includes a bit line 301, a word line 302, a transistor 303, and a capacitor element 304. Actually, a plurality of memory cells having such structures is arranged in a matrix.

Figure 3B:
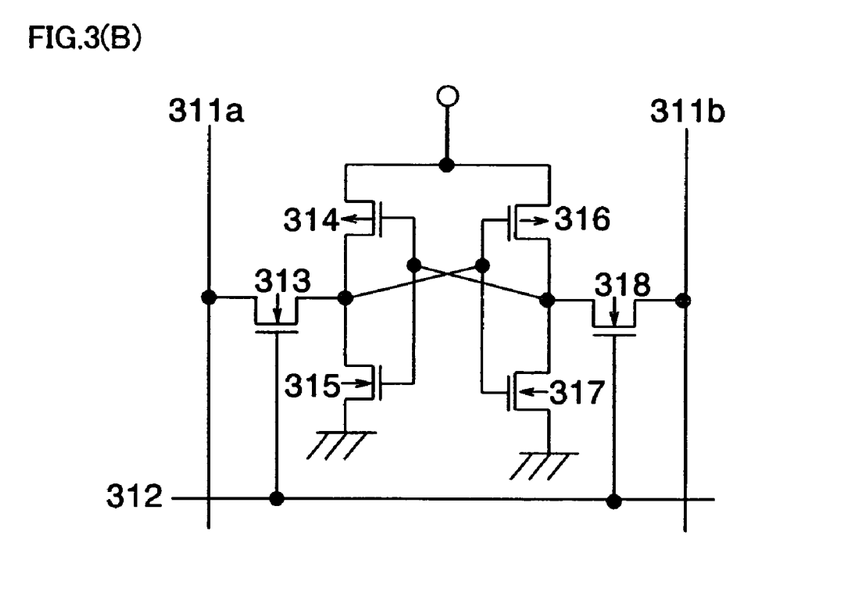

FIG. 3B is a circuit diagram showing an example of a memory cell structure of an SRAM (Static Random Access Memory), and the SRAM includes a bit line 311a, a bit line 311b, a word line 312, and transistors 313, 314, 315, 316, 317, and 318. Actually, a plurality of memory cells having such structures is arranged in a matrix.

By using the layer 103 having a transistor obtained according to Embodiment Mode 1 or 2 in this specification in the case of manufacturing a memory as shown in FIGS. 3A and 3B, a memory, which is much thinner than a memory formed on a silicon wafer, having flexibility can be manufactured at low cost.

The present invention disclosed in this specification can also be applied to a memory other than the DRAM and the SRAM, and a CPU.

Embodiment Mode 4

An example of an RFID tag (a wireless IC tag) manufactured using the layer 103 having a transistor obtained by the present invention disclosed in this specification is shown.

Figure 4A:
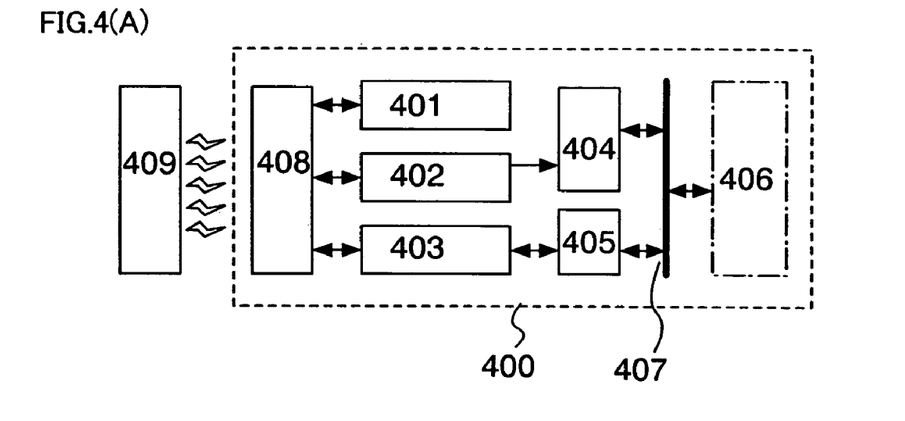
FIGS. 4A and 4B are block diagrams-showing examples of an RFID tag.
Figure 4B:
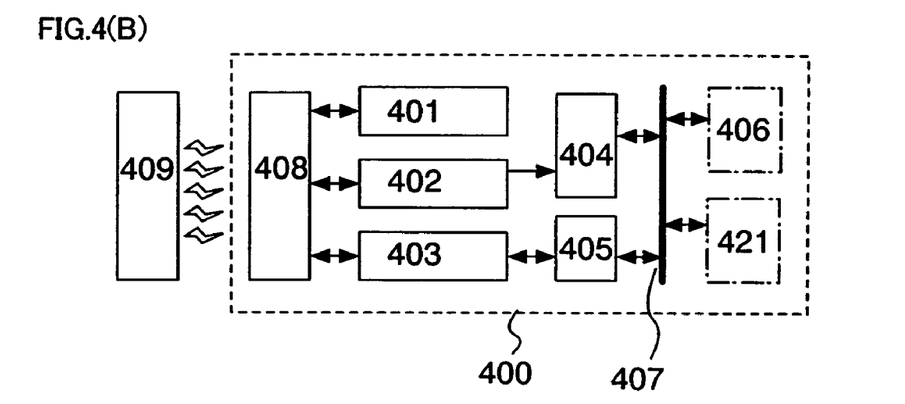

FIGS. 4B and 4B are block diagrams of examples of the RFID tag. An RFID tag 400 can communicate data without contact, and includes a power source circuit 401, a clock generating circuit 402, a data demodulation/modulation circuit 403, a control circuit 404, an interface circuit 405, a memory circuit 406, a bus 407, and an antenna 408. FIG. 4B shows the case where a CPU 421 is provided in addition to the components of FIG. 4A.

The power source circuit 401 generates a power source based on an AC signal that is inputted from the antenna 408. The clock generating circuit 402 generates a clock signal based on a signal that is inputted from the antenna 408. The data demodulation/modulation circuit 403 demodulates/modulates data that is communicated with a reader/writer 409. The control circuit 404 controls the memory circuit 406. The antenna 408 carries out reception of signals and transmission/reception of data.

As the memory circuit 406, a mask ROM, an EPROM (Erasable Programmable Read Only Memory), an EEPROM (Electrically Erasable and Programmable Read Only Memory), a flash memory, an organic memory, or the like can be used, other than the DRAM or the SRAM described in Embodiment 1. Note that the organic memory has a structure in which an organic compound layer is provided between a pair of electrodes or a structure in which a layer containing an organic compound and an inorganic compound is provided between a pair of electrodes. By adopting the organic memory as the memory circuit 406 of the RFID tag, reduction in size, thickness, and weight of the RFID tag can be achieved.

FIGS. 6A to 6D show examples of uses of the RFID tag. By mounting the RFID tag as described in this embodiment on a product such as a recording medium 601 on which music or a movie is recorded, a case in which the recording medium 601 is housed, a book 602, a product package 603, or clothing 604, management of sales, stock, checkout, or the like, prevention of loss or theft, or the like of the product on which the RFID tag is mounted can be achieved. In each of FIGS. 6A to 6D, an example of position 600 of the RFID tag is shown.

By using the layer 103 having a transistor obtained according to Embodiment Mode 1 or 2 in this specification in manufacturing the RFID tag as shown in FIGS. 4A and 4B, the RFID tag can be thinned and supplied at low cost. Therefore, the present invention disclosed in this specification can contribute to widespread use of RFID tags.

This embodiment can be combined with Embodiment 1.

This application is based on Japanese Patent Application serial no. 2005-160729 filed in Japan Patent Office on May 31, 2005, the contents of which are hereby incorporated by reference.

What is claimed is:

1. A manufacturing method of a semiconductor device, comprising the steps of:
    forming an insulating film over a substrate;
    forming a first layer having a metal film over the insulating film;
    forming a second layer having a transistor over the first layer having the metal film;
    applying a resin material over the second layer having the transistor;
    curing the resin material by a heat treatment at a first heat treatment temperature to form a resin layer in a heating apparatus;
    peeling the second layer having the transistor from the substrate by a heat treatment at a second heat treatment temperature which is higher than the first heat treatment temperature in the heating apparatus; and
    peeling the resin layer from the second layer having the transistor by a heat treatment at a third heat treatment temperature which is higher than the second heat treatment temperature without extracting from the heating apparatus.

2. A manufacturing method of a semiconductor device, comprising the steps of:
    forming an insulating film over a substrate;
    forming a first layer having a metal film over the insulating film;

forming a second layer having a transistor over the first layer having the metal film;

applying a resin material over the second layer having the transistor;

curing the resin material by a heat treatment at a first heat treatment temperature to form a resin layer in a heating apparatus;

exposing a part of the first layer having the metal film in a region where the transistor is not provided over the first layer having the metal film;

peeling the second layer having the transistor from the substrate by a heat treatment at a second heat treatment temperature which is higher than the first heat treatment temperature in the heating apparatus; and peeling the resin layer from the second layer having the transistor by a heat treatment at a third heat treatment temperature which is higher than the second heat treatment temperature without extracting from the heating apparatus.

3. A manufacturing method of a semiconductor device according to claim 2, wherein the exposed part of the first layer having the metal film is formed by irradiating the resin layer with a laser beam.

4. A manufacturing method of a semiconductor device according to claim 2, wherein the exposed part of the first layer having the metal film includes a side surface of the first layer having the metal film.

5. A manufacturing method of a semiconductor device according to claim 1, wherein the resin material is epoxy resin.

6. A manufacturing method of a semiconductor device according to claim 2, wherein the resin material is epoxy resin.

7. A manufacturing method of a semiconductor device according to claim 1, wherein the first heat treatment temperature is 50° C. or more and less than 90° C., the second heat treatment temperature is 90° C. or more and 120° C. or less, and the third heat treatment temperature is 150° C. or more and 250° C. or less.

8. A manufacturing method of a semiconductor device according to claim 2, wherein the first heat treatment temperature is 50° C. or more and less than 90° C., the second heat treatment temperature is 90° C. or more and 120° C. or less, and the third heat treatment temperature is 150° C. or more and 250° C. or less.

9. A manufacturing method of a semiconductor device according to claim 1, wherein the transistor is a thin film transistor.

10. A manufacturing method of a semiconductor device according to claim 2, wherein the transistor is a thin film transistor.

11. A manufacturing method of a semiconductor device according to claim 1, further comprising:

forming metal oxide between the first layer having the metal film and the second layer having the transistor.

12. A manufacturing method of a semiconductor device according to claim 2, further comprising:

forming metal oxide between the first layer having the metal film and the second layer having the transistor.

13. A manufacturing method of a semiconductor device according to claim 11, wherein the metal film and the metal oxide include the same metal element.

14. A manufacturing method of a semiconductor device according to claim 12, wherein the metal film and the metal oxide include the same metal element.

15. A manufacturing method of a semiconductor device according to claim 1, wherein the heating apparatus is an oven or a furnace.

16. A manufacturing method of a semiconductor device according to claim 2, wherein the heating apparatus is an oven or a furnace.

17. A manufacturing method of a semiconductor device according to claim 1, further comprising an antenna connected to the transistor over the second layer.

18. A manufacturing method of a semiconductor device according to claim 2, further comprising an antenna connected to the transistor over the second layer.

19. A manufacturing method of a semiconductor device according to claim 1, wherein the semiconductor device is a memory, a CPU, an integrated circuit, or an RFID tag.

20. A manufacturing method of a semiconductor device according to claim 2, wherein the semiconductor device is a memory, a CPU, an integrated circuit, or a RFID tag.

* * * * *